(12) United States Patent
Herold

(10) Patent No.: US 7,064,604 B2
(45) Date of Patent: Jun. 20, 2006

(54) AMPLIFIER SWITCH

(75) Inventor: Joachim Herold, Flintsbach (DE)

(73) Assignee: Kathrein-Werke KG, Rosenheim (DE)

( * ) Notice: Subject to any disclaimer, the term of this patent is extended or adjusted under 35 U.S.C. 154(b) by 0 days.

(21) Appl. No.: 10/483,402

(22) PCT Filed: Jul. 4, 2002

(86) PCT No.: PCT/EP02/07442

§ 371 (c)(1),
(2), (4) Date: Feb. 4, 2004

(87) PCT Pub. No.: WO03/007473

PCT Pub. Date: Jan. 23, 2003

(65) Prior Publication Data

US 2005/0174170 A1   Aug. 11, 2005

(30) Foreign Application Priority Data

Jul. 12, 2001   (DE) .................. 101 33 862

(51) Int. Cl.
*H03F 1/14* (2006.01)

(52) U.S. Cl. ........................... 330/51; 330/9

(58) Field of Classification Search .......... 330/51, 330/150, 151, 302, 310, 9

See application file for complete search history.

(56) References Cited

U.S. PATENT DOCUMENTS

| | | | | |
|---|---|---|---|---|
| 4,748,418 A | * | 5/1988 | Kerth | 330/9 |
| 5,008,631 A | * | 4/1991 | Scherer et al. | 330/51 |
| 5,418,490 A | | 5/1995 | Kaegebein | |
| 5,661,434 A | * | 8/1997 | Brozovich et al. | 330/51 |
| 6,069,526 A | * | 5/2000 | Ballantyne | 330/51 |
| 6,169,449 B1 | * | 1/2001 | Hasegawa | 330/51 |
| 6,265,935 B1 | * | 7/2001 | Kaneda et al. | 330/51 |
| 6,313,698 B1 | * | 11/2001 | Zhang et al. | 330/51 |
| 6,329,875 B1 | * | 12/2001 | Ishida et al. | 330/51 |
| 6,580,327 B1 | * | 6/2003 | Joffe et al. | 330/304 |
| 2001/0034217 A1 | * | 10/2001 | Loke et al. | 455/126 |
| 2002/0044015 A1 | * | 4/2002 | Nakamura | 330/51 |
| 2002/0140503 A1 | * | 10/2002 | Fujiwara et al. | 330/51 |

FOREIGN PATENT DOCUMENTS

| | | |
|---|---|---|
| EP | 0 847 135 A2 | 6/1998 |
| EP | 0 964 511 A1 | 12/1999 |
| EP | 1 032 120 A2 | 8/2000 |
| EP | 1 054 507 A2 | 11/2000 |
| GB | 2 334 168 A | 8/1999 |
| WO | 92/22937 | 12/1992 |

* cited by examiner

*Primary Examiner*—Rexford Barnie
*Assistant Examiner*—Linh V. Nguyen
(74) *Attorney, Agent, or Firm*—Nixon & Vanderhye P.C.

(57) ABSTRACT

The invention relates to an improved amplifier switch which for example has the following features: between an in-gate (1; 1.1, 1.2) and an out-gate (3; 3.1, 3.2) an amplifier branch (5; 5.1, 5.2) and at least one bridging line (7; 7.1, 7.2) that can be switched on and off in parallel thereto are provided. At the outlet side, an amplifier branch (5; 5.1, 5.2) is connected to a pertaining bridging line (7; 7.1, 7.2) via a summing circuit or a summing point (17) that is/are linked with the out-gate (3; 3.1, 3.2). The bridging line (7; 7.1, 7.2), between the pertaining switch contact (K1) of the pertaining switch (9; 9.1, 9.2) and the summing circuit or the summing point (17), has an electrical length that corresponds to $\lambda/2$.

6 Claims, 1 Drawing Sheet

AMPLIFIER SWITCH

CROSS-REFERENCES TO RELATED APPLICATIONS

This application is the US national phase of international application PCT/EP02/07442 filed in English on 4 Jul. 2002, which designated the US. PCT/EP02/07442 claims priority to DE Application No. 101 33 862.7 filed 12 Jul. 2001. The entire contents of these applications are incorporated herein by reference

FIELD

The technology herein relates to an amplifier switch.

BACKGROUND AND SUMMARY

It is known to use redundant circuits, in particular in radio frequency amplifier equipment.

Such a redundant circuit arrangement according to the genus-forming prior art, such as is known basically from U.S. Pat. No. 5,418,490, comprises an amplifier circuit which is provided between an input gate and an output gate. This amplifier circuit has two amplifier stages which are connected in parallel, both stages being capable of being switched on and off at the input end and the output end by using a switch, generally a relay switch. One of the two amplifier stages is connected through via the input-end and output-end relay, whereas the input and output of the second amplifier stage which is arranged in parallel is switched off. If the amplifier stage which is switched on fails, the contacts of the input-end and output-end relays are switched over to the second amplifier which was previously not required. If the second amplifier stage should also fail, in each case one relay switch is also connected in series with the input-end and output-end switchover relays in order to switch over between the two amplifier stages so that in such a case a through-connection path which is parallel with the two amplifier stages is connected through while bypassing both amplifiers.

Arrangements in which both parallel amplifier stages are connected together continuously in a parallel mode are basically also known. If one amplifier stage fails, at least the second amplifier stage remains active. However, a failure in an amplifier stage leads to a reduction in amplification (for example of 4 to 8 dB) and to an increase in the noise coefficient by, for example 2 to 4 dB. In addition, there is no optimum adaptation to the input and output. This operating state must therefore be referred to as a worsened operating condition which makes repair absolutely necessary. A further problem with this arrangement is that, for example, in the case of an electrical discharge (lightning strike, etc.) both amplifier stages may also fail in this case, as both amplifier stages are basically operating in parallel.

The technology herein provides an amplifier switch which is improved in comparison with the above, in particular for a circuit having at least two amplifier circuits or amplifier stages, in which case the amplifier switch is to have in particular a low throughput attenuation in the bypass mode and a very good adaptation in the amplifier mode.

The technology herein uses surprisingly simple means to achieve significant improvements in comparison with the prior art.

The amplifier switch according to an exemplary illustrative non-limiting arrangement herein can already be implemented with a single amplifier circuit or stage. Whereas, in the prior art, the switch, preferably in the form of a relay, has to be provided respectively both at the input end and at the output end for a switching over process so that, in the case of a defect, it is possible to switch over from the amplifier branch into a bridging path in parallel with the amplifier branch, according to an exemplary illustrative non-limiting implementation, only a single switch, i.e. generally a switch relay, is now arranged at the input or at the output. The bridging path which leads from a switching contact of the switch device to a summing point in the amplifier path is now dimensioned in such a way that the electrical length is approximately $\lambda/2$. In other words, the open relay contact is operated across the $\lambda/2$-long bridging line with high impedance, transformed to the opposite gate, i.e. in the open circuit mode.

According to one preferred exemplary illustrative non-limiting implementation, a PIN diode is also connected in the amplifier line between the amplifier and the summing point. This is because, if the amplifier stage is not operational, a connection without a PIN diode could lead to increased loading in the bridging line and throughput line. The amplifier stage can be connected with high impedance to the line by means of the PIN diode.

According to an exemplary illustrative non-limiting implementation, only one switch relay (in comparison with at least two switches in the prior art) is therefore necessary.

However, the advantages according to an exemplary illustrative non-limiting implementation are apparent, especially in the design of a redundant circuit.

This is because, in one particularly preferred exemplary non-limiting illustrative implementation, such a redundant circuit is then constructed with at least two amplifiers or amplifier stages in such a way that they are not connected in parallel with one another as in the prior art but rather cascaded in series. There are also no decoupling problems in this context.

The exemplary illustrative circuit operates here in such a way that in each case only one amplifier circuit and amplifier stage is switched on in a home position, when the respective bridging line is switched on by switching over the switch or relay, the amplifier there is thus switched off. If the activated amplifier stage fails, the relay can switch over to the bridging path, the relay or the switch of the further amplifier stage interrupting the connection to the bridging line and switching over in order to activate the associated amplifier stage. As a result, the same electrical conditions are always precisely present so that no damping problems or adaptation problems or other problems occur.

Above all, such a redundant circuit with two amplifier stages requires only two switches which may be arranged either on the input side or output side in relation to the respective amplifier stage.

BRIEF DESCRIPTION OF THE DRAWINGS

These and other features and advantages will be better and more completely understood by referring to the following detailed description of exemplary non-limiting illustrative implementations in conjunction with the drawings of which.

DETAILED DESCRIPTION

Figure 1:
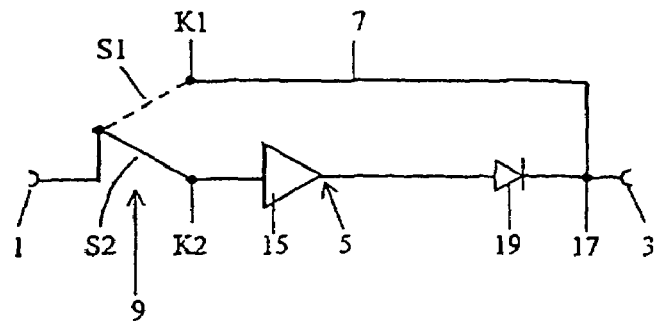
FIG. 1 shows a first schematic exemplary illustrative non-limiting implementation.

FIG. 1 shows a first exemplary illustrative non-limiting implementation of an amplifier switch which is provided between an input gate 1 and an output gate 3.

The circuit device comprises two branches, namely an amplifier branch 5 and a bridging line 7 which is arranged in parallel thereto.

The switch 9, generally a relay switch 9, is connected to the input gate 1, it being possible to switch over from the switch contact K1 to the switch contact K2. If the switch is in the switched state S2, the input gate 1 is connected to the switch contact K2, as a result of which the amplifier circuit 15 which is connected in the amplifier branch 5 is switched on.

If the input-end switch 9 switches over into the switched state S1, the amplifier circuit 15 is switched off and the bridging line 7 is connected to the input gate 1 via the contact K1.

In the switched position S2 which is shown in FIG. 1, the fed-in power therefore passes from the input gate 1 to the amplifier 15, the amplifier input power being conducted to the output gate 3 via a low-impedance PIN diode 19 which is additionally provided in the amplifier branch between the amplifier circuit 15 and the summing point 17. The bridging line 7 which is explained above and which has a disconnected terminal K1 in this switched state is, however, dimensioned in such a way that it has an electrical length which corresponds to approximately $\lambda/2$. As a result, the open relay contact K1 is now transformed in high-impedance fashion to the output gate 3 via this $\lambda/2$-long line. The bridging line 7, together with the amplifier branch 5, is connected to a summing point 17.

Figure 2:
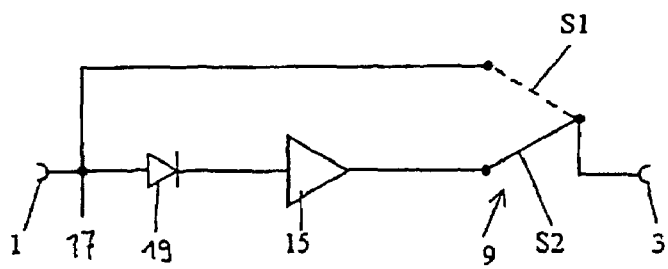
FIG. 2 shows an exemplary illustrative non-limiting implementation which is modified in comparison with FIG. 1.

The exemplary illustrative non-limiting implementation according to FIG. 2 differs from that according to FIG. 1 in that an input-end switch 9 is no longer provided but instead an output-end switch 19, otherwise the electrical length of the bridging circuit 15 also corresponds again to approximately $\lambda/2$. In this non-limiting implementation, the series PIN diode 19 is connected to the input of the amplifier 15, i.e. upstream of the amplifier 15. In this case also, the electrical length of the bridging line 7 shown in FIG. 2 corresponds (in the disconnected state) to approximately $\lambda/2$.

Figure 3:
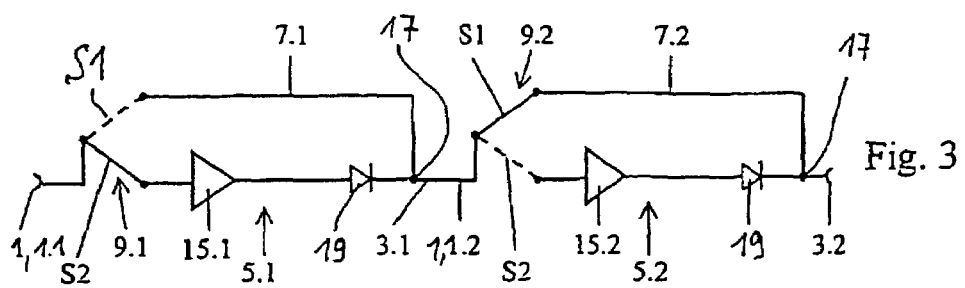
FIG. 3 shows an exemplary illustrative non-limiting implementation of a redundant amplifier circuit with two amplifier stages in a first exemplary embodiment.
Figure 4:
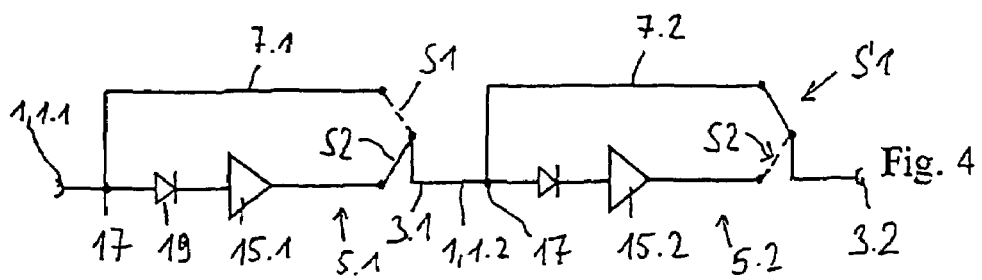
FIG. 4 shows an exemplary illustrative non-limiting implementation which is modified once more.

The first exemplary illustrative non-limiting implementation of a redundant amplifier switch, in which two amplifier switches are connected in series according to exemplary embodiment 1, will now be described with reference to FIG. 3.

In this exemplary illustrative non-limiting implementation, the output gate 3.1 of the first amplifier switching stage therefore simultaneously constitutes the input gate 1.2 of the second amplifier switching stage. An input-end switch 9.1 or 9.2 is assigned here to each amplifier switching stage.

In the home position, for example, the first input-end switch 9.1 is switched to the switched position S2 in which the power which is fed in from the input gate 1 is fed via the amplifier branch 5.1 of the downstream PIN diode 13 of the second amplifier stage 5.2 in which the switch 9.2 is in the switched stage S1, that is to say the amplified power coming from the first amplifier stage is passed on to the output gate 3.2 via the bridging line 7.2.

Failure of the first amplifier stage 15.1 leads to a situation in which the first relay switch 9.1 is switched over into the switched position S1, and as a result the amplifier circuit 15.1 is bridged by switching on the associated bridging line 7.1. At the same time, the switch 9.2 of the second amplifier stage 15.2 is switched over from the position S1 according to FIG. 3 into the position S2 so that the second amplifier stage 15.2 is now activated.

As the two amplifier stages are basically of the same design and have the same functionality (with respect to amplification, HF behavior, adaptation, etc.), the same electrical conditions occur as before the switching over process.

A repair is not absolutely necessary but rather should be performed only in a reasonable time period in order to ensure as far as possible that the second amplifier does not also fail.

This circuit arrangement also has the advantage that, for example, in the case of an electrical discharge (lightning strike) and destruction of the first amplifier stage 15.1 caused as a result thereof, the second amplifier stage 15.2 is basically protected as it is decoupled. As a result of the switching over between the two relay switches 9.1 and 9.2 it is therefore possible to activate the intact amplifier stage 15.2.

Only if, after the failure of the first amplifier stage, the second amplifier stage 15.2 was also to fail at a later time before a repair is carried out, would the second switching contact 9.2 then also switch over again in such a way that the bridging line 7.2 which is provided there is also activated so that the input gate 1.1 is connected to the output gate 3.2 via the two bridging lines 7.1 and 7.2 which are connected in series.

While the technology herein has been described in connection with exemplary illustrative non-limiting implementations, the invention is not to be limited by the disclosure. The invention is intended to be defined by the claims and to cover all corresponding and equivalent arrangements whether or not specifically disclosed herein.

The invention claimed is:

1. A redundant amplifier switch comprising:
   at least two amplifier branches each having an input gate and an output gate,
   a circuit arrangement having associated switches in such a way that it is possible to produce an electrical connection between the input gate and the output gate via one of the plurality of amplifier branches or via a bridging line,
   wherein the amplifier branches are connected in series in such a way that the output gate of one amplifier branch is electrically connected to the input gate of another amplifier branch,
   the bridging line which being switchable on and off and connected in parallel with each amplifier branch, between the associated input gate and the associated output gate of said amplifier branch,
   the circuit arrangement for switching the transmission from one amplifier branch to another amplifier branch or to the bridging line respectively connected in parallel therewith being constructed in such a way that a switch via which the input gate is connected either to the amplifier branch or the associated bridging line is connected between the input gate and the assigned amplifier branch and the associated bridging line, and the amplifier branch is connected at the output end to the associated bridging line via a summing circuit or a summing point which is connected to the associated output gate of the relevant amplifier branch,
   the respective bridging line having, between the associated switching contact of the associated switch and the respectively assigned summing circuit or the respectively assigned summing point, an electrical length which corresponds to approximately $\lambda/2$.

2. The redundant amplifier switch as claimed in claim 1, wherein a PIN diode is connected between the respective amplifier circuit and a relevant amplifier branch and the respective assigned summing circuit or the assigned summing point.

3. The redundant amplifier switch as claimed in claim 1, wherein the switches are formed from relay switches, preferably from relay switches with a low throughput attenuation.

4. A redundant amplifier switch comprising:
   at least two amplifier branches each having an input gate and an output gate,
   a circuit arrangement having associated switches in such a way that it is possible to produce an electrical connection between the input gate and the output gate via one of the plurality of amplifier branches or via a bridging line,
   wherein the amplifier branches are connected in series in such a way that the output gate of one amplifier branch is electrically connected to the input gate of another amplifier branch,
   the bridging line being switchable on and off and connected in parallel with each amplifier branch, between the associated input gate and the associated output gate of said amplifier branch,
   the circuit arrangement for switching the transmission from one amplifier branch to another amplifier branch or to the bridging line respectively connected in parallel therewith being constructed in such a way that a switch via which the output gate is connected either to the amplifier branch or the associated bridging line is provided between the output gate and the assigned amplifier branch and the associated bridging line, and the amplifier branch being connected at the input end to the associated bridging line via a summing circuit or a summing point which is connected to the associated input gate, and
   the respective bridging line having, between the associated switching contact of the associated switch and the respectively assigned summing circuit or the respectively assigned summing point, an electrical length which corresponds to approximately $\lambda/2$.

5. The redundant amplifier switch as claimed in claim 4, wherein a PIN diode is connected between the respective amplifier circuit and a relevant amplifier branch and the respective assigned summing circuit or the assigned summing point.

6. The redundant amplifier switch as claimed in claim 4, wherein the switches are formed from relay switches, preferably from relay switches with a low throughput attenuation.

* * * * *